United States Patent
Nishita et al.

(10) Patent No.: US 10,333,272 B2
(45) Date of Patent: Jun. 25, 2019

(54) OPTICAL DEVICE (71) Applicant: FURUKAWA ELECTRIC CO., LTD., Tokyo (JP)

(72) Inventors: Masayoshi Nishita, Tokyo (JP); Atsushi Yamamoto, Tokyo (JP); Atsushi Shinozaki, Tokyo (JP)

(73) Assignee: FURUKAWA ELECTRIC CO., LTD., Tokyo (JP)

(*) Notice: Subject to any disclaimer, the term of this patent is extended or adjusted under 35 U.S.C. 154(b) by 0 days.

(21) Appl. No.: 15/851,784

(22) Filed: Dec. 22, 2017

(65) Prior Publication Data
US 2018/0183206 A1 Jun. 28, 2018

(30) Foreign Application Priority Data

Dec. 27, 2016 (JP) ................................. 2016-254025
Dec. 20, 2017 (JP) ................................. 2017-243491

(51) Int. Cl.
*H01S 5/042* (2006.01)
*H01S 5/024* (2006.01)
(Continued)

(52) U.S. Cl.
CPC .......... *H01S 5/0425* (2013.01); *H01R 12/57* (2013.01); *H05K 1/0203* (2013.01); *H05K 1/117* (2013.01);
(Continued)

(58) Field of Classification Search
CPC .............. H01S 5/0425; H01S 5/02216; H01S 5/02469; H01S 5/02284; H05K 1/117;
(Continued)

(56) References Cited

U.S. PATENT DOCUMENTS 7,186,037 B2 * 3/2007 Yuuki ................... G02B 6/4201
385/88
7,300,215 B2 * 11/2007 Hsiao ................... G02B 6/4201
385/139
(Continued)

FOREIGN PATENT DOCUMENTS

JP 2013-118315 6/2013

OTHER PUBLICATIONS

Atsushi Yamamoto, et al., "Development of a Micro ITLA for Optical Digital Coherent Communication", Furukawa Review, No. 134, 10 pages (with English Translation).

*Primary Examiner* — John Bedtelyon
(74) *Attorney, Agent, or Firm* — Oblon, McClelland, Maier & Neustadt, L.L.P.

(57) ABSTRACT

An optical device includes: an optical module provided with an electrical pin; a printed wiring board that is connected to the electrical pin of the optical module, on which a control circuit for controlling the optical module is mounted, and on which an opening is formed; a first plate-shaped member to which the printed wiring board is fixed; a first fixing member that is inserted into the opening of the printed wiring board, and that fixes the printed wiring board with the first plate-shaped member; a second plate-shaped member that is disposed such that the printed wiring board is interposed between the second plate-shaped member and the first plate-shaped member; and a second fixing member that fixes the first fixing member with the second plate-shaped member such that the optical module is retained between the first plate-shaped member and the second plate-shaped member.

18 Claims, 10 Drawing Sheets (51) Int. Cl.
*H01S 5/022* (2006.01)
*H05K 1/18* (2006.01)
*H05K 1/02* (2006.01)
*H05K 1/11* (2006.01)
*H05K 3/00* (2006.01)
*H01R 12/57* (2011.01)

(52) U.S. Cl.
CPC ............. *H05K 1/183* (2013.01); *H05K 1/184* (2013.01); *H05K 3/0061* (2013.01); *H01S 5/02216* (2013.01); *H01S 5/02284* (2013.01); *H01S 5/02469* (2013.01); *H05K 2201/10121* (2013.01); *H05K 2201/10409* (2013.01); *H05K 2201/2036* (2013.01)

(58) Field of Classification Search
CPC ...... H05K 1/184; H05K 3/0061; H05K 1/183; H05K 1/0203; H05K 2201/2036; H05K 2201/10409; H05K 2201/10121; H01R 12/57; G02B 6/4201; G02B 6/4251; G02B 6/4255; G02B 6/4256; G02B 6/4257; G02B 6/4259; G02B 6/426; G02B 6/4261; G02B 6/4262; G02B 6/4266; G02B 6/4268; G02B 6/4269; G02B 6/4272; G02B 6/4274; G02B 6/4278; G02B 6/428; G02B 6/4281; G02B 6/4283; G02B 6/4284
See application file for complete search history.

(56) References Cited

U.S. PATENT DOCUMENTS

| | | | |
|---|---|---|---|
| 9,525,448 B2* | 12/2016 | Hsieh | H04B 1/38 |
| 9,893,815 B2* | 2/2018 | Ootorii | G02B 6/4214 |
| 2005/0135758 A1* | 6/2005 | Sato | G02B 6/4201 385/92 |

* cited by examiner

OPTICAL DEVICE

CROSS-REFERENCE TO RELATED APPLICATIONS

The present application claims priority to and incorporates by reference the entire contents of Japanese Patent Application Nos. 2016-254025 filed in Japan on Dec. 27, 2016 and 2017-243491 filed in Japan on Dec. 20, 2017.

BACKGROUND OF THE INVENTION

1. Field of the Invention

The present disclosure relates to an optical device including an optical module and a control circuit.

2. Description of the Related Art

In recent years, a further reduction in size of optical devices including an optical module and a control circuit such as an Integrable Tunable Laser Assembly (ITLA) has been desired (Document 1: Atsushi Yamamoto, Takeo Okaniwa, Yoshitaka Yafuso, and Masayoshi Nishita, "Development of a Micro ITLA for Optical Digital Coherent Communication", FURUKAWA REVIEW, No. 46 (2015) pp. 2-6).

With a recent increase in communication traffics, communication devices are mounted in high density to increase communication capacity. Thus, a reduction in the size of the optical devices is desired. To reduce the size of the optical devices, it is also desired to reduce the size of the printed wiring board on which a control circuit is mounted in the optical device. However, it has been thought that the size of the optical devices needs to be reduced while maintaining the functions in the related art or adding new functions.

There is a need for solving at least a part of the above-described problems of the prior art.

SUMMARY OF THE INVENTION

According to an embodiment of the present disclosure, an optical device includes: an optical module provided with an electrical pin; a printed wiring board that is connected to the electrical pin of the optical module, on which a control circuit for controlling the optical module is mounted, and on which an opening is formed; a first plate-shaped member to which the printed wiring board is fixed; a first fixing member that is inserted into the opening of the printed wiring board, and that fixes the printed wiring board with the first plate-shaped member; a second plate-shaped member that is disposed such that the printed wiring board is interposed between the second plate-shaped member and the first plate-shaped member; and a second fixing member that fixes the first fixing member with the second plate-shaped member such that the optical module is retained between the first plate-shaped member and the second plate-shaped member.

The above-described matter and other objects, features, advantages, and technical and industrial significance of the present disclosure will be better understood by reading the following detailed description of the present disclosure with reference to the accompanying drawings.

DETAILED DESCRIPTION OF THE PREFERRED EMBODIMENTS

Hereinafter, embodiments of an optical device according to the present disclosure will be described in detail with reference to the accompanying drawings. It is to be noted that the present disclosure is not limited to the embodiments, and various modifications may be made without departing from the scope and spirit of the present disclosure. In the drawings, the same reference numerals are used to describe the same or corresponding components as appropriate. The drawings may be schematic, and it should be noted that dimensional relations of the components such as the ratio of the components may differ from the actual ones. It is also apparent that portions with different relative sizes or ratios may be included between the respective drawings.

The inventors of the present disclosure have diligently studied, for example, to increase the mounting area of a printed wiring board on which a control circuit is mounted. The inventors have noted that an optical module and a printed wiring board on which a control circuit for controlling the optical module is mounted, are individually fixed to a plate-shaped member by screws, in the optical device with a related-art structure. The inventors have then conceived an idea that an area on the printed wiring board where electronic components cannot be disposed and pattern wiring cannot be formed due to the presence of fixing structures can be reduced, by reducing the locations fixed by screws. Moreover, because it is possible to reduce the area where the printed wiring board cannot be disposed in the related-art structure, the inventors have conceived that the mounting area of the printed wiring board can be increased.

First Embodiment

Figure 1:
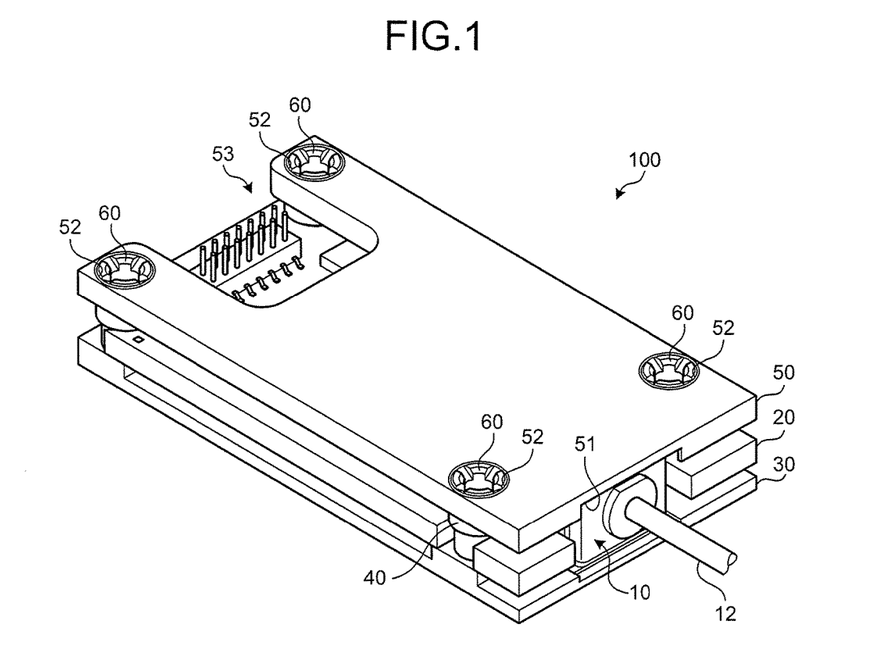
FIG. 1 is a schematic perspective view illustrating a configuration of an optical device according to a first embodiment.

FIG. 1 is a schematic perspective view illustrating a configuration of an optical device according to a first embodiment. As illustrated in FIG. 1, an optical device 100 at least includes an optical module 10, a printed wiring board 20, a first plate-shaped member 30, four first screw members 40 that are one aspect of a "first fixing member(s)", a second plate-shaped member 50, and four second screw members 60 that are one aspect of a "second fixing member(s)".

Figure 2:
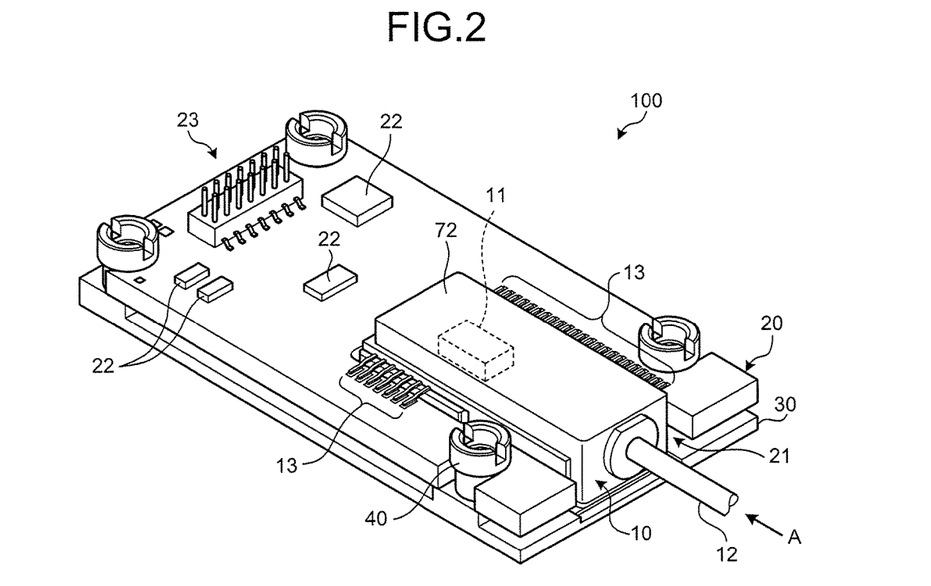
FIG. 2 is a diagram illustrating a state in which a second screw member and a second plate-shaped member are removed from the optical device illustrated in FIG. 1.
Figure 3:
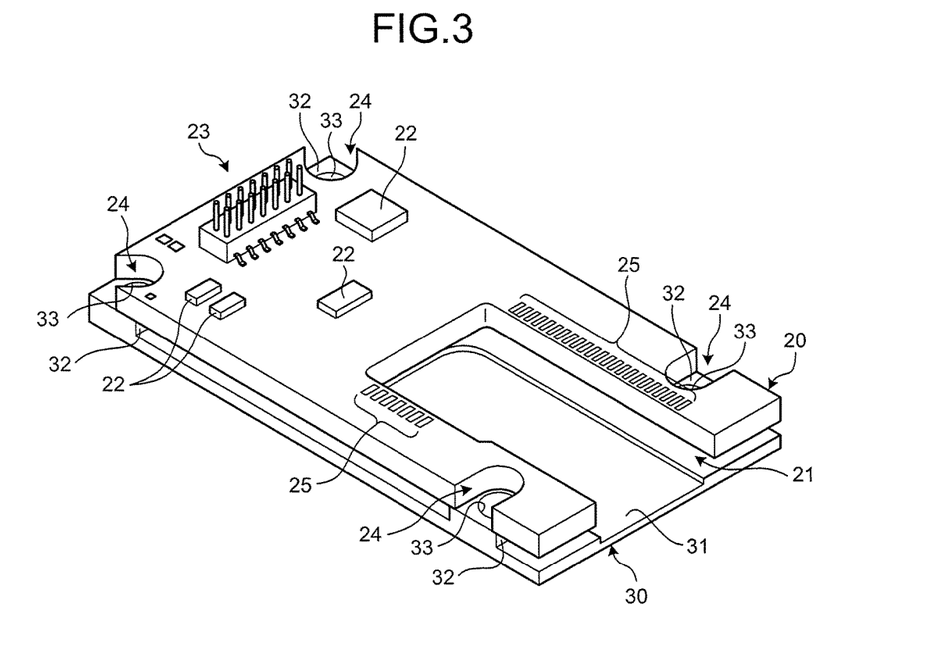
FIG. 3 is a diagram illustrating a state in which a first screw member and an optical module are further removed from the state in FIG. 2.
Figure 4:
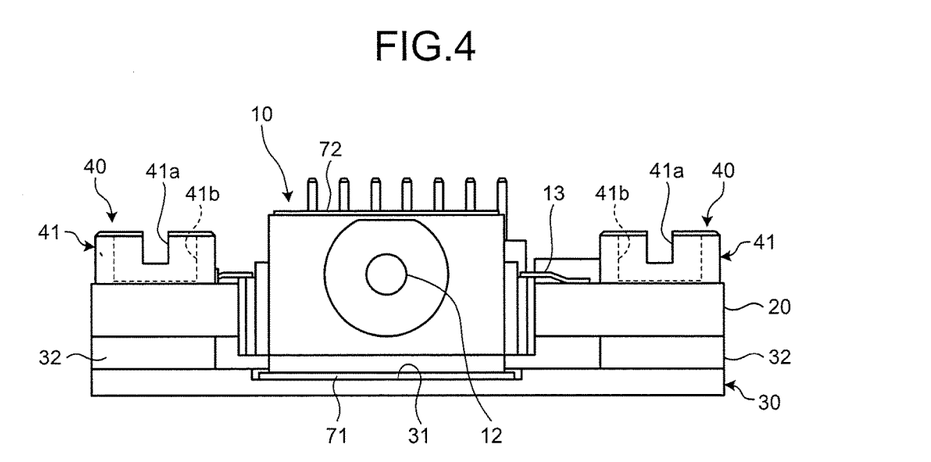
FIG. 4 is a side view taken in the direction of the arrow A in FIG. 2.
Figure 5A:
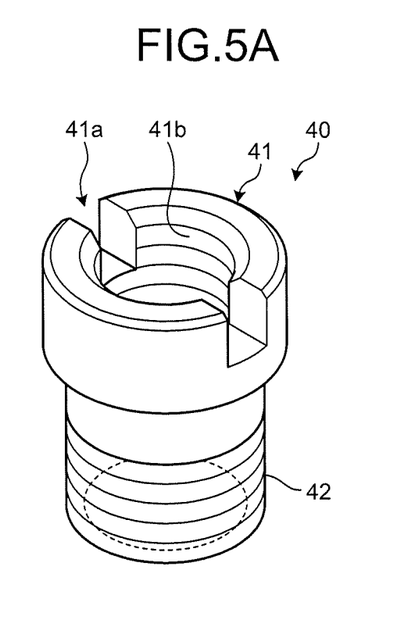
FIG. 5A is a schematic view of the first screw member.
Figure 5B:
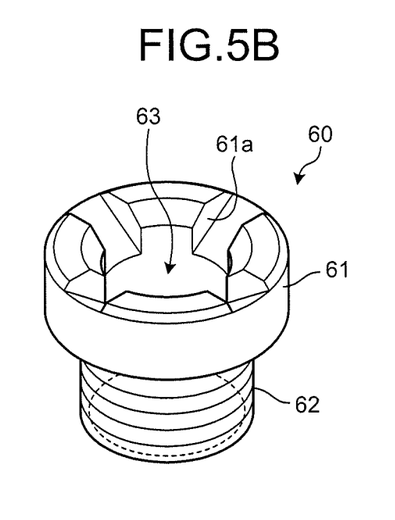
FIG. 5B is a schematic view of the second screw member.

FIG. 2 is a diagram illustrating a state in which the second screw members 60 and the second plate-shaped member 50 are removed from the optical device 100. FIG. 3 is a diagram illustrating a state in which the first screw members 40 and the optical module 10 are further removed from the state in FIG. 2. FIG. 4 is a side view taken in the direction of the arrow A in FIG. 2. FIGS. 5A and 5B are schematic views of one of the first screw members 40 and one of the second screw members 60, respectively. Hereinafter, the optical device 100 will be described with reference to FIGS. 1 to 5B.

The optical module 10 is a wavelength-tunable semiconductor laser module including a wavelength-tunable semiconductor laser device 11 as illustrated in FIG. 2. The optical module 10 outputs laser beams having desired wavelength and power from an optical fiber 12. For example, the optical module 10 has a configuration as disclosed in Document 1: Atsushi Yamamoto, Takeo Okaniwa, Yoshitaka Yafuso, and Masayoshi Nishita, "Development of a Micro ITLA for Optical Digital Coherent Communication", FURUKAWA REVIEW, No. 46 (2015) pp. 2-6) and in Japanese Laid-open Patent Application No. 2013-118315. In the optical module 10, the wavelength-tunable semiconductor laser device is integrated with a plurality of semiconductor lasers, an optical coupler, and a semiconductor optical amplifier. The optical module 10 also has a known wavelength lock mechanism using an etalon filter, to control the wavelength of the wavelength-tunable semiconductor laser device 11. The optical module 10 also includes a temperature adjusting device for adjusting the respective temperatures of the wavelength-tunable semiconductor laser device 11 and the etalon filter, and a temperature monitoring device. The optical module 10 further includes a plurality of electrical pins 13 for supplying driving current to the wavelength-tunable semiconductor laser device 11 and the temperature adjusting device, and for outputting a temperature monitor signal, and an optical power monitor signal and a wavelength monitor signal in the wavelength lock mechanism. Each of the electrical pins 13 is electrically connected to the printed wiring board 20.

A notch portion 21 in which the optical module 10 is to be disposed is formed on the printed wiring board 20 (see FIG. 3). A control circuit 22 for controlling the optical module 10 is also mounted on the printed wiring board 20. In FIG. 2, FIG. 3 and the like, only a part of components of the control circuit 22 is illustrated. The control circuit 22 is electrically connected to a higher-level device, which is not illustrated, via a plurality of connector pins 23. The control circuit 22 supplies driving current to the optical module 10, and controls an operation of the optical module 10, on the basis of various monitor signals output from the optical module 10. The control circuit 22 includes a digital arithmetic device, memory, a current control circuit, a temperature monitor circuit, an optical power monitor circuit, a wavelength monitor circuit, and the like. A wiring pattern for connecting the components of the control circuit 22 to each other, or for connecting the components, the electrical pins 13 and the connector pins 23 of the optical module 10 to each other is formed on the printed wiring board 20.

Moreover, four openings 24 are formed on the printed wiring board 20 for fixing the printed wiring board 20 with the first plate-shaped member 30. In the first embodiment, each of the openings 24 is a U-shaped notch. A plurality of terminal patterns 25 for electrically connecting the printed wiring board 20 with the electrical pins 13 of the optical module 10 are provided around the notch portion 21.

The first plate-shaped member 30 is a plate-shaped member on which the printed wiring board 20 is placed and fixed. For example, the first plate-shaped member 30 is formed of a material with a high thermal conductivity such as metal including aluminum and ceramics. However, the material is not particularly limited thereto.

As illustrated in FIG. 3, a concave portion 31 in which the optical module 10 is to be disposed is formed on the first plate-shaped member 30. The first plate-shaped member 30 is also provided with four convex portions 32 that come into contact with the printed wiring board 20. The convex portions 32 are formed at positions where portions formed with the four openings 24 of the printed wiring board 20 come into contact with the four respective convex portions 32 when the printed wiring board 20 is mounted on the first plate-shaped member 30. A screw hole 33 in which a screw thread is formed is provided on each of the convex portions 32.

The four first screw members 40 formed of metal or ceramics are inserted into the respective openings 24 of the printed wiring board 20 and fix the printed wiring board 20 with the first plate-shaped member 30.

As illustrated in FIG. 5A, the first screw member 40 includes a head portion 41 having a substantially cylindrical shape, and a screw portion 42 that is an external thread and is one aspect of a "fixing portion(s)". The head portion 41 is formed with a slot 41a and a screw hole 41b. The screw hole 41b is an internal thread having an inner wall on which a screw thread is formed. The screw hole 41b is a through hole that penetrates through the head portion 41 along the center axis. The screw thread need not be formed over the entire depth direction of the screw hole 41b, and as will be described below, may be formed in a certain area so that the second screw member 60 can be screwed in. Moreover, the inner diameter of the portion where the screw thread is formed in the screw hole 41b may be the same as or different from the inner diameter of the portion other than the portion where the screw thread is formed in the screw hole 41b. For example, the inner diameter of the portion where the screw thread is formed in the screw hole 41b may be larger or smaller than or the same size as the inner diameter of the portion other than the portion where the screw thread is formed in the screw hole 41b.

The second plate-shaped member 50 is disposed such that the printed wiring board 20 is interposed between the second plate-shaped member 50 and the first plate-shaped member 30. For example, the second plate-shaped member 50 is formed of a material with a high thermal conductivity such as metal including aluminum and ceramics. However, note that the material is not particularly limited thereto.

As illustrated in FIG. 1, a concave portion 51 into which the optical module 10 is to be disposed is formed on the second plate-shaped member 50. The second plate-shaped member 50 is also provided with four countersunk holes 52 through which the second screw members 60 are to be inserted, which will be described below. The countersunk holes 52 are formed at the positions corresponding to the four first screw members 40. A notch portion 53 is also formed on the second plate-shaped member 50 so that the first connector pins 23 of the printed wiring board 20 and the second plate-shaped member 50 do not interfere with each other. The connector pins 23 do not project out from the surface of the second plate-shaped member 50 (surface at the side opposite from the surface facing the printed wiring board 20).

The four second screw members 60 each formed of a metal material or ceramic fix the first screw members 40 with the second plate-shaped member 50. As illustrated in FIG. 5B, each of the second screw members 60 includes a head portion 61 having a substantially cylindrical shape and a screw portion 62 that is an external thread that is capable of screwing into the screw hole 41b of one of the first screw members 40 and is one aspect of the fixing portion. A cross recess 61a is formed in the head portion 61. Moreover, a through hole 63 that penetrates through the second screw member 60 along the center axis is formed on the second screw member 60.

The four second screw members 60 fix the respective first screw member 40 with the second plate-shaped member 50. The optical module 10 is retained (sandwiched) between the first plate-shaped member 30 and the second plate-shaped member 50 when the four second screw members 60 fix the four first screw members 40 with the second plate-shaped member 50.

As illustrated in FIG. 2 and FIG. 4, heat sinks 71 and 72 are interposed between the optical module 10 and the first plate-shaped member 30 and between the optical module 10 and the second plate-shaped member 50, respectively. The heat sinks 71 and 72 operate so that the heat generated by the optical module 10 can be easily dissipated to the first plate-shaped member 30 and the second plate-shaped member 50. For example, each of the heat-sinks is formed of resin and graphite each having a good heat dissipation property, and may have a thin sheet-like structure (heat dissipation sheet) or a relatively thick pad-like structure (heat dissipation pad). The heat-sink may also be something like heat dissipation grease. The heat sinks 71 and 72 may be made of the same material or different materials from each other. In the above example, the heat sinks 71 and 72 may both be formed of a pad-like structure made of resin, or the heat sink 71 may be formed of a sheet-like structure made of graphite and the heat sink 72 may be heat dissipation grease.

Assembly Method

An assembly method of the optical device 100 will now be described with reference to FIGS. 1 to 4, FIG. 6, and FIG. 7.

As illustrated in FIG. 3, the printed wiring board 20 is to be mounted on the first plate-shaped member 30. In this process, the printed wiring board 20 is mounted on the first plate-shaped member 30 by aligning the openings 24 of the printed wiring board 20 with the respective screw holes 33 of the first plate-shaped member 30 corresponding to the openings 24.

Figure 6:
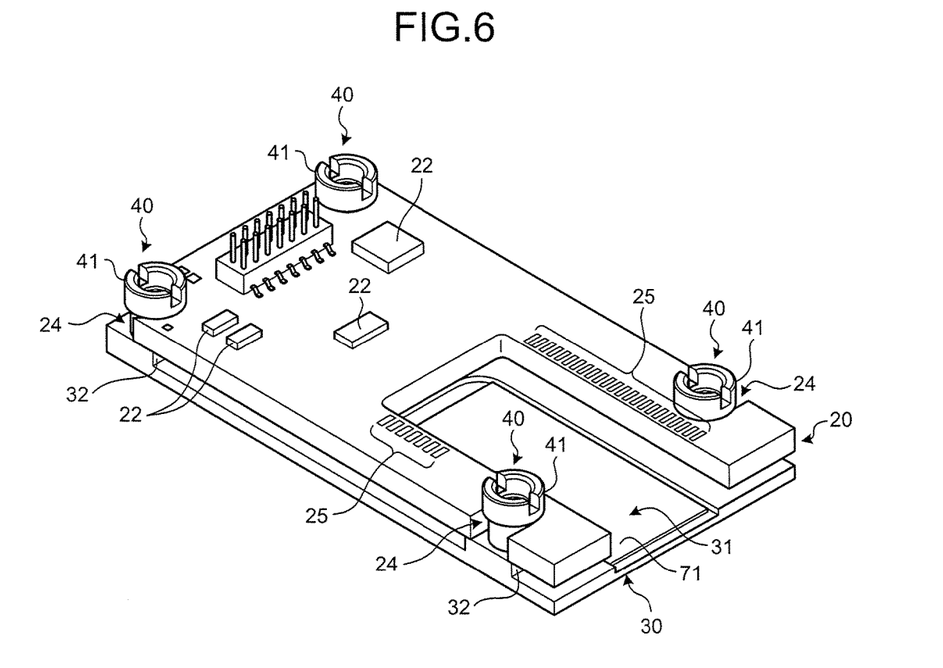
FIG. 6 is a view illustrating a method of assembling the optical device of FIG. 1.
Figure 7:
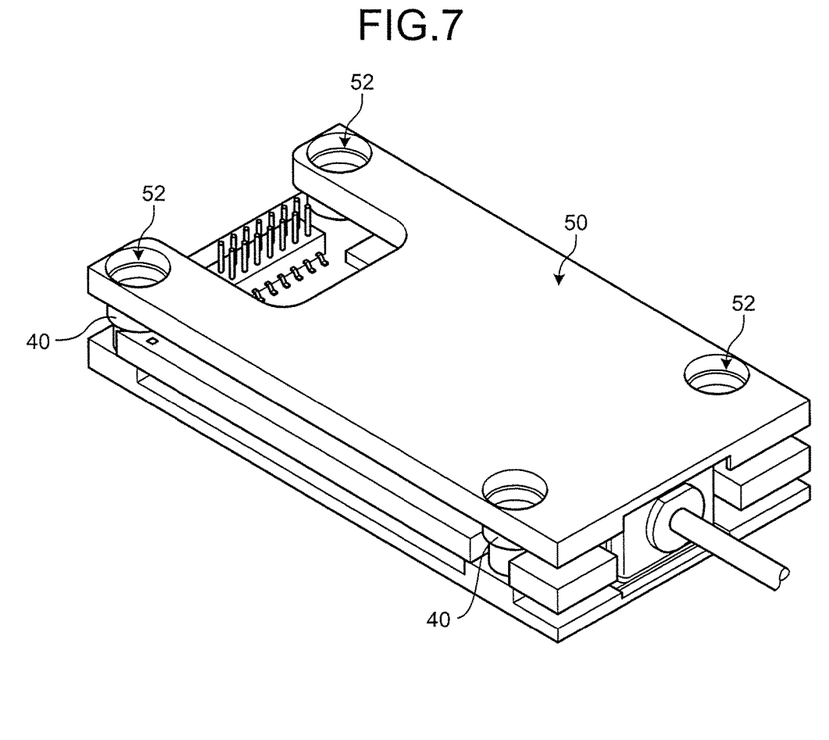
FIG. 7 is another view illustrating a method of assembling the optical device of FIG. 1.

Then, as illustrated in FIG. 6, the first screw member 40 is inserted into each of the openings 24 of the printed wiring board 20, and the screw portion 42 of the first screw member 40 is screwed into the screw hole 33 of the first plate-shaped member 30, using a flathead screwdriver and the like. The printed wiring board 20 will be fixed to the first plate-shaped member 30 when the convex portions 32 of the first plate-shaped member 30 and the head portions 41 of the first screw members 40 come into contact with the printed wiring board 20. Moreover, the heat sink 71 is disposed in the concave portion 31 of the first plate-shaped member 30, before or after the printed wiring board 20 is fixed to the first plate-shaped member 30.

Next, as illustrated in FIG. 2 and FIG. 4, the optical module 10 provided with the heat sink 72 on one side is prepared. The optical module 10 is then disposed in the concave portion 31 of the first plate-shaped member 30 with the heat sink 71 interposed therebetween. In this process, the electrical pins 13 of the optical module 10 are brought in contact with the respective terminal patterns 25 of the printed wiring board 20. In this process, the electrical pins 13 and the terminal patterns 25 may be bonded by soldering.

Next, the second plate-shaped member 50 is to be mounted on the first screw members 40. In this process, the second plate-shaped member 50 is mounted on the first screw members 40 by aligning the screw holes 41b of the first screw members 40 with the respective countersunk holes 52 of the second plate-shaped member 50 corresponding to the screw holes 41b.

Then, the second screw member 60 is inserted into each of the countersunk holes 52, and the screw portion 62 of the second screw member 60 is screwed into the screw hole 41b of the head portion 41 of the first screw member 40. The first screw members 40 will be fixed to the second plate-shaped member 50 when the head portions 41 of the first screw members 40 and the head portions 61 of the second screw members 60 come into contact with the second plate-shaped member 50. Although the head portions 61 of the second screw members 60 are to be housed in the countersunk holes 52, the head portions 61 do not project out from the surface of the second plate-shaped member 50, because the upper facet of each of the head portions 61 is substantially flush with the surface of the second plate-shaped member 50. In this manner, the assembly of the optical device 100 will be completed.

Figure 8:
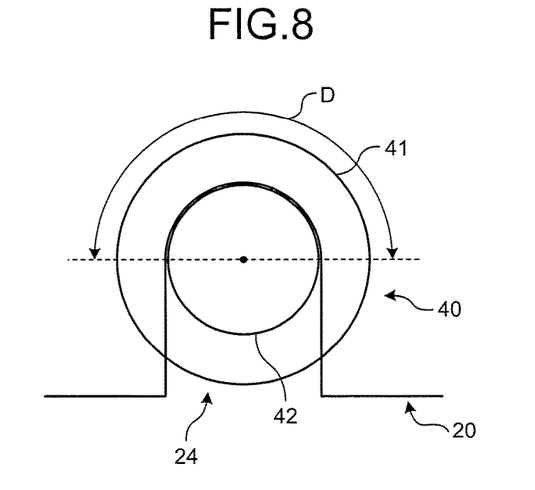
FIG. 8 is a view illustrating a relationship between an opening of a printed wiring board and a head portion of the first screw member.

In this example, as illustrated in FIG. 8, each of the openings 24 is formed such that the outer periphery of the head portion 41 of the first screw member 40 comes into contact with the printed wiring board 20 over one-half of the length of the head portion 41 in an outer circumference direction D. Consequently, the contact area between the head portion 41 and the printed wiring board 20 becomes sufficient to allow the printed wiring board 20 to be fixed without fail. It is preferable that the opening 24 be shaped such that the head portion 41 of the first screw member 40 comes into contact with the printed wiring board 20 along one-half or more of the length of the head portion 41 in the outer circumference direction D.

With the optical device 100 according to the present first embodiment, the printed wiring board 20 is fixed to the first plate-shaped member 30 with the first screw members 40, and the first screw members 40 are fixed to the second plate-shaped member 50 with the second screw members 60. Consequently, the optical module 10 is fixedly retained between the first plate-shaped member 30 and the second plate-shaped member 50. Thus, compared to the related-art structure disclosed in Document 1: Atsushi Yamamoto, Takeo Okaniwa, Yoshitaka Yafuso, and Masayoshi Nishita, "Development of a Micro ITLA for Optical Digital Coherent Communication", FURUKAWA REVIEW, No. 46 (2015) pp. 2-6, the number of fixing structures for fixing the printed wiring board and the optical module to the plate-shaped members are reduced. As a result, an area where electronic components cannot be disposed or where pattern wiring cannot be formed due to the presence of the fixing structures is reduced on the printed wiring board 20. The printed wiring board 20 can also be disposed on an area of the optical device 100 where the fixing structures are disposed to fix the optical module in the related-art structure. As a result, it is possible to increase the area of the printed wiring board 20, and the area to be used as a mounting area of the printed wiring board 20. Hence, it is possible to increase the mounting area than that of the related-art structure.

Moreover, the printed wiring board 20 is fixedly retained between the convex portions 32 of the first plate-shaped member 30 and the head portions 41 of the first screw members 40. As a result, in the optical device 100, the printed wiring board 20 is prevented from becoming loose, and even if vibration and impact are applied, the printed wiring board 20 does not move relative to the first plate-shaped member 30 and the first screw members 40. Consequently, the optical device 100 is durable against vibration and impact.

Furthermore, in the optical device 100, the screw hole 41b that is a through hole is formed in the first screw member 40, and the through hole 63 is formed in the second screw member 60. Consequently, the screw hole 41b and the through hole 63 are communicated with each other to form a through hole. This through hole can be used to fix the optical device 100 to an object to be fixed such as the other members including a heat dissipation member and devices. In the related-art structure, the through hole structure and the fixing structure described above are formed by separate members. However, in the optical device 100, the fixing structure and the through hole structure are integrally formed. Consequently, it is possible to further increase the mounting area of the printed wiring board 20.

Still furthermore, in the optical device 100, the second screw members 60 and the connector pins 23 do not project out from the surface of the second plate-shaped member 50. Thus, when the optical device 100 is fixed to the object to be fixed on the second plate-shaped member 50 side, a gap caused by the interference between the second screw members 60 and the object to be fixed will not be formed between the second plate-shaped member 50 and the object to be fixed. Moreover, when the connector pins 23 are to be connected to a receptacle connector provided on the object to be fixed, it is possible to prevent or significantly suppress a situation where the connector pins 23 touch the bottom of a fitting hole of the receptacle connector and cannot be inserted further, and a gap is formed between the second plate-shaped member 50 and the object to be fixed. Even if a gap is formed, the width of the gap will be relatively small. As a result, when the optical device 100 is fixed to the object to be fixed, it is possible to save space in the laminating direction (height direction) of the first plate-shaped member 30, the printed wiring board 20, and the second plate-shaped member 50.

Figure 9:
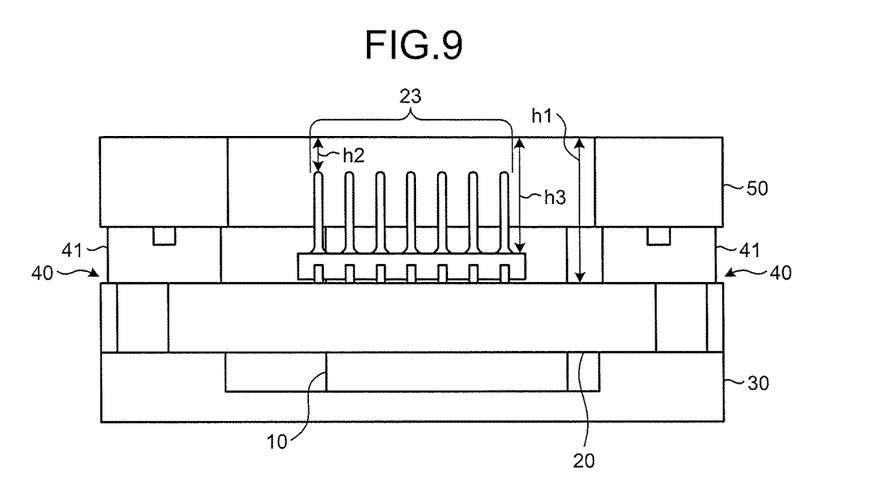
FIG. 9 is a view illustrating relationship between heights.

Still furthermore, in the optical device 100, as illustrated in FIG. 9, when it is assumed that height h1 is height from the surface of the printed wiring board 20 (surface facing the second plate-shaped member 50) to the surface of the second plate-shaped member 50, the height h1 is determined by the total of the thickness of the second plate-shaped member 50 and the height of the head portion 41 of the first screw member 40. Because the second plate-shaped member 50 and the first screw members 40 are formed of metal or ceramics, the thickness of the second plate-shaped member 50 and the height of the head portion 41 of the first screw member 40 can be formed with high dimensional accuracy. Consequently, the height h1 can also have high dimensional accuracy. When the height h1 has high dimensional accuracy, an error from the design value of the height from the tip end of each of the connector pins 23 to the surface of the second plate-shaped member 50 (it is assumed height h2) will be decreased. Thus, it is possible to set the tolerance value of the height h2 to a small value. An error from the design value of the height from the root of the connector pin 23 to the surface of the second plate-shaped member 50 (it is assumed height h3) will also be decreased. Consequently, it is possible to set the tolerance value of the height h3 to a small value. When the error of the height h2 and height 3 is small, it is possible to prevent or significantly suppress a situation where a gap is formed between the second plate-shaped member 50 and the object to be fixed when the connector pins 23 are connected to the receptacle connector provided on the object to be fixed. Even if a gap is formed, the width of the gap will be relatively small. It is also possible to prevent or significantly suppress a situation where insufficient electrical connection is made because insertion length of the connector pins 23 to the receptacle connector is not enough due to the high height h2 and height h3.

Modification

Figure 10A:
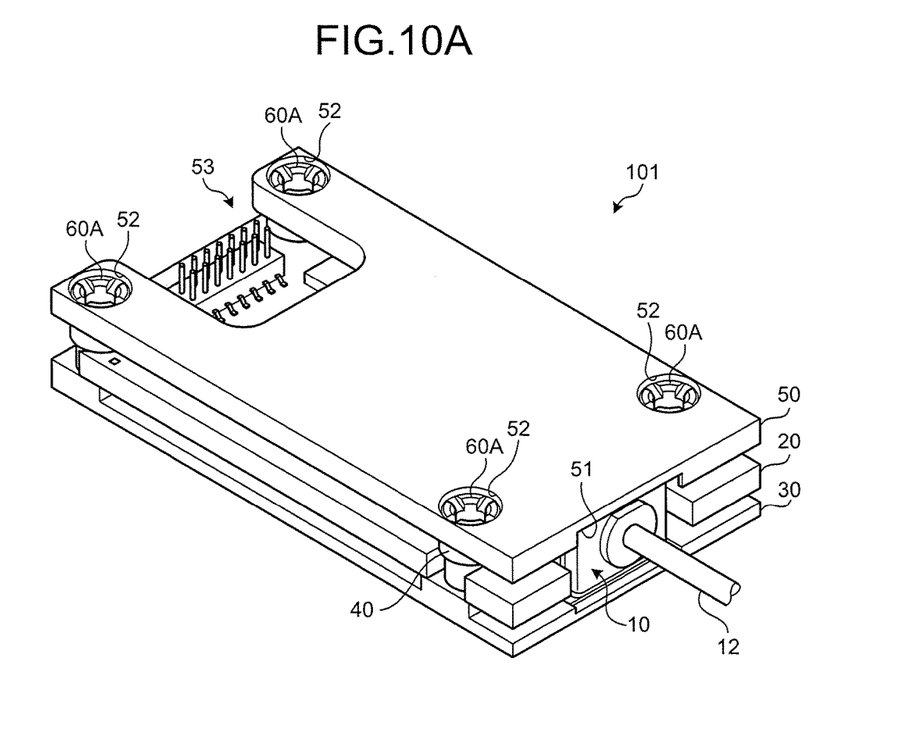
FIG. 10A is a schematic perspective view illustrating a configuration of an optical device according to a modification of the first embodiment.
Figure 10B:
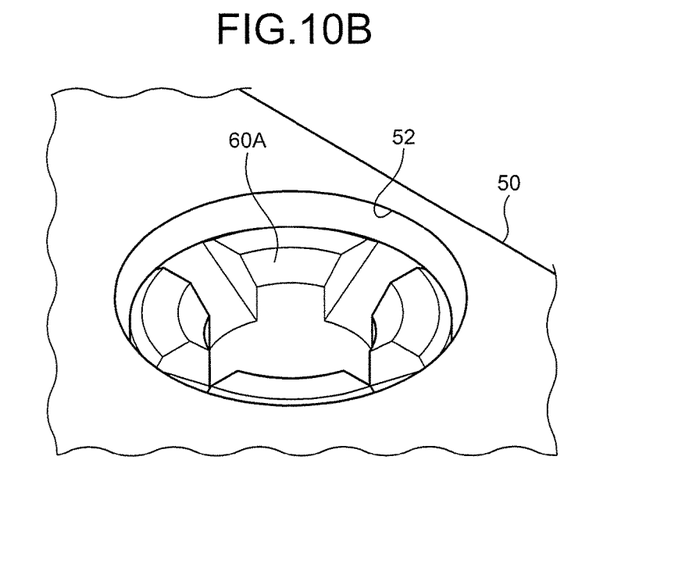
FIG. 10B is a partial enlarged view of FIG. 10A.

FIG. 10A is a schematic perspective view illustrating a configuration of an optical device 101 according to a modification of the first embodiment. FIG. 10B is a partial enlarged view of FIG. 10A. The configuration of the optical device 101 is the same as that of the optical device 100 according to the first embodiment except that the second screw member 60 is replaced with a second screw member 60A. Hereinafter, the second screw member 60A will be described.

Compared to the second screw member 60 illustrated in FIG. 5B, the height of a head portion of the second screw members 60A is lower than that of the head portion 61 of the second screw member 60. Consequently, in a state where a screw portion of the second screw member 60A is screwed into the screw hole 41b of the head portion 41 of the first screw member 40, and the head portion of the second screw member 60A is housed in each of the countersunk holes 52, the upper facet of the head portion of the second screw member 60A is lower than the surface of the second plate-shaped member 50, as illustrated in FIGS. 10A and 10B. As a result, when the optical device 101 is fixed to an object to be fixed at the second plate-shaped member 50 side, a gap caused by the interference between the second screw member 60A and the object to be fixed will not be formed between the second plate-shaped member 50 and the object to be fixed.

Second Embodiment

Figure 11:
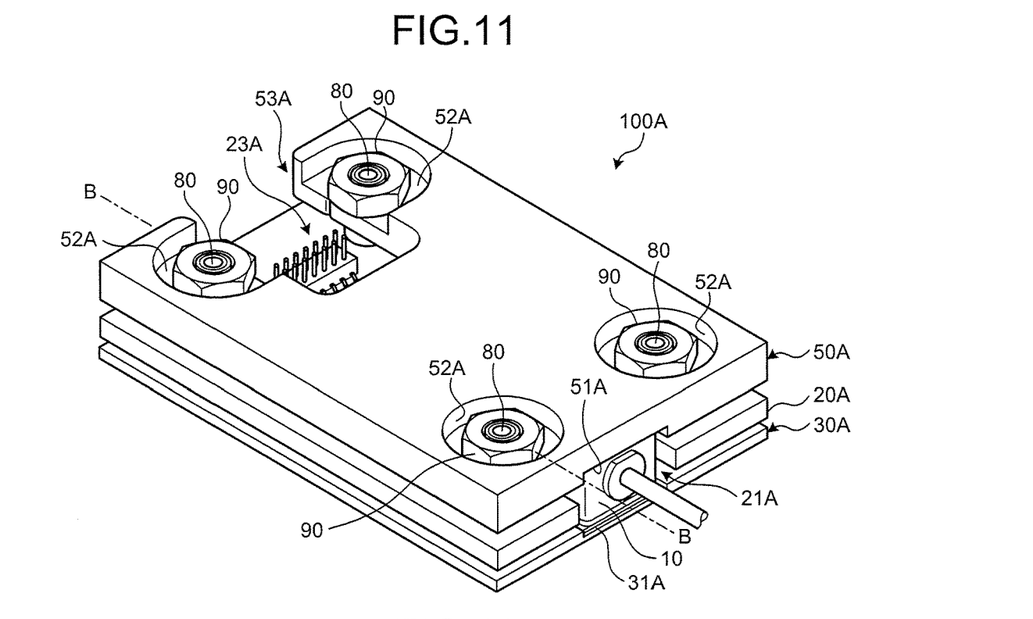
FIG. 11 is a schematic perspective view illustrating a configuration of an optical device according to a second embodiment.

FIG. 11 is a schematic perspective view illustrating a configuration of an optical device according to a second embodiment. As illustrated in FIG. 11, an optical device 100A at least includes the optical module 10, a printed wiring board 20A, a first plate-shaped member 30A, four screw members 80 that are one aspect of the "first fixing member", a second plate-shaped member 50A, and four nut members 90 that are one aspect of the "second fixing member".

Figure 12:
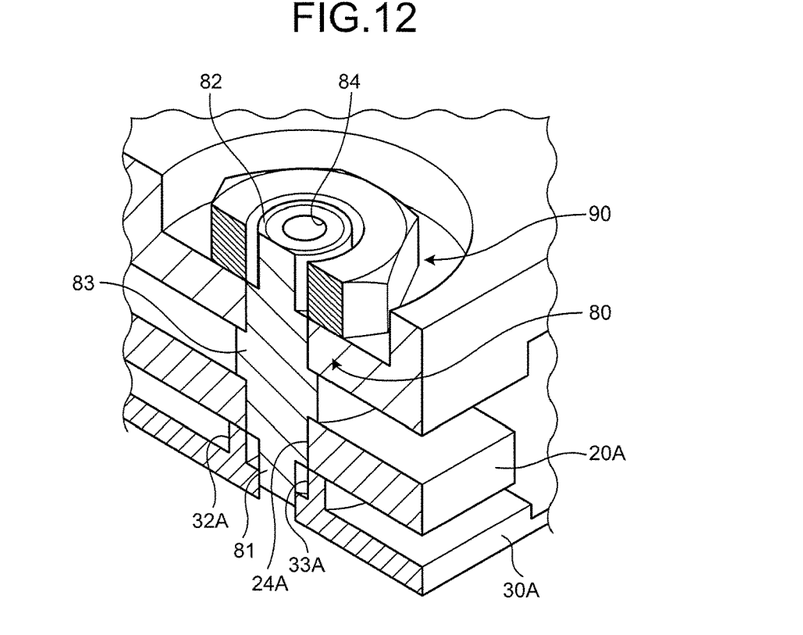
FIG. 12 is a partial cross-sectional view cut along the line B-B in FIG. 11.
Figure 13:
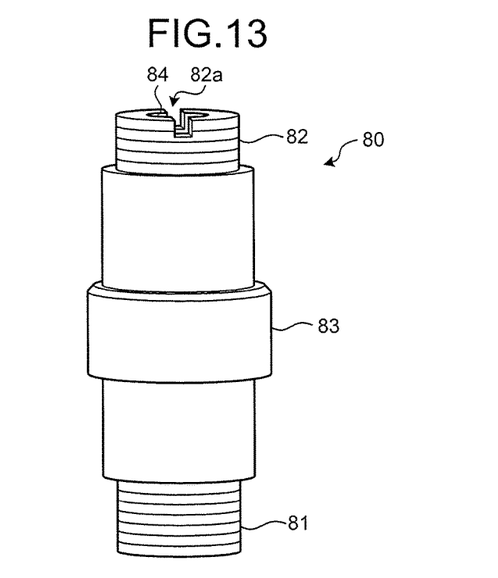
FIG. 13 is a schematic view of a screw member.

FIG. 12 is a partial cross-sectional view cut along the line B-B in FIG. 11. FIG. 13 is a schematic diagram of one of the screw members 80. In the following, the optical device 100A will be described with reference to FIGS. 11 and 12.

Because the optical module 10 is the same as the optical module 10 of the optical device 100, the description thereof will be omitted.

Similar to the printed wiring board 20, the printed wiring board 20A includes a notch portion 21A into which the optical module 10 is to be disposed. The printed wiring board 20A also includes a control circuit, which is not illustrated, for controlling the optical module 10. The control circuit is electrically connected to a higher-level device, which is not illustrated, via a plurality of connector pins 23A. The control circuit supplies driving current to the optical module 10, and controls the operation of the optical module 10, on the basis of various monitor signals output from the optical module 10. A wiring pattern for connecting the components of the control circuit to each other, or for connecting the components, the electrical pins 13 and the connector pins 23A of the optical module 10 to each other is formed on the printed wiring board 20A.

Moreover, four openings 24A are formed on the printed wiring board 20A for fixing the printed wiring board 20A with the first plate-shaped member 30A. In the second embodiment, each of the openings 24A is a through hole formed on the printed wiring board 20A. A terminal pattern for electrically connecting the printed wiring board 20A with the electrical pins 13 of the optical module 10 is provided around the notch portion 21A.

The first plate-shaped member 30A is a plate-shaped member on which the printed wiring board 20A is placed and fixed. For example, the first plate-shaped member 30A is formed of a material with a high thermal conductivity such as metal and ceramics. However, the material is not particularly limited thereto.

A concave portion 31A into which the optical module 10 is to be disposed is formed on the first plate-shaped member 30A. The first plate-shaped member 30A is also provided with four convex portions 32A that come into contact with the printed wiring board 20A. The convex portions 32A are formed at positions where portions formed with the four openings 24A of the printed wiring board 20A come into contact with the four respective convex portions 32A when the printed wiring board 20A is mounted on the first plate-shaped member 30A. Moreover, each of the convex portions 32A has a screw hole 33A including therein a screw thread.

As illustrated in FIG. 13, each of the four screw members 80 formed of a metal material or ceramic includes a first screw portion 81 that is one aspect of a "first fixing portion", a second screw portion 82 on which a slot 82a is formed and that is one aspect of a "second fixing portion", and a large diameter portion 83 that is placed between the first screw portion 81 and the second screw portion 82. As illustrated in FIG. 12, the printed wiring board 20A will be fixed to the first plate-shaped member 30A when the first screw portion 81 is inserted into the opening 24A of the printed wiring board 20A. Moreover, a through hole 84 that penetrates through the screw member 80 along the center axis is formed on the screw member 80.

The second plate-shaped member 50A is disposed so as to interpose the printed wiring board 20A between the second plate-shaped member 50A and the first plate-shaped member 30A. For example, the second plate-shaped member 50A is formed of a material with a high thermal conductivity such as metal and ceramics. However, the material is not particularly limited thereto.

A concave portion 51A into which the optical module 10 is to be disposed is formed on the second plate-shaped member 50A. The second screw portions 82 of the screw members 80 are to be inserted into the second plate-shaped member 50A. Four countersunk holes 52A into which the nut members 90 are to be housed are also formed on the second plate-shaped member 50A. The countersunk holes 52A are formed at positions where the second screw portions 82 are to be inserted. A notch portion 53A is also formed on the second plate-shaped member 50A so that the connector pins 23A of the printed wiring board 20A and the second plate-shaped member 50A do not interfere with each other. The connector pins 23A do not project out from the surface of the second plate-shaped member 50A (surface at the side opposite from the surface facing the printed wiring board 20A).

When each of the nut members 90 is screwed into the second screw portion 82 of each of the screw members 80, the screw members 80 are fixed to the second plate-shaped member 50A so as the optical module 10 is retained between the first plate-shaped member 30A and the second plate-shaped member 50A.

More specifically, the printed wiring board 20A will be fixed to the first plate-shaped member 30A, when the first screw portions 81 are screwed into the screw holes 33A of the first plate-shaped member 30A, and the first plate-shaped member 30A and the large diameter portions 83 come into contact with the printed wiring board 20A. Moreover, the screw members 80 will be fixed to the second plate-shaped member 50A, when the nut members 90 are screwed into the second screw portions 82 of the screw members 80, and the nut members 90 and the large diameter portions 83 come into contact with the second plate-shaped member 50A. Although the nut members 90 are to be housed in the countersunk holes 52A, the nut members 90 do not project out from the surface of the second plate-shaped member 50A, because the upper facet of each of the nut members 90 is substantially flush with or lower than the surface of the second plate-shaped member 50A.

Similar to the first embodiment, also in the optical device 100A, a heat sink is interposed between the optical module 10 and the first plate-shaped member 30A and between the optical module 10 and the second plate-shaped member 50A.

In the optical device 100A according to the present second embodiment, compared to the related-art structure disclosed in Document 1: Atsushi Yamamoto, Takeo Okaniwa, Yoshitaka Yafuso, and Masayoshi Nishita, "Development of a Micro ITLA for Optical Digital Coherent Communication", FURUKAWA REVIEW, No. 46 (2015) pp. 2-6, the number of fixing structures for fixing the printed wiring board and the optical module to the plate-shaped members are reduced. As a result, it is possible to increase the area of the printed wiring board 20A, and the area to be used as a mounting area on the printed wiring board 20A. Hence, it is possible to increase the mounting area of the printed wiring board 20A than that of the related-art structure.

In the optical device 100A, the through hole 84 is formed in the screw member 80. The through hole 84 can be used to fix the optical device 100A to an object to be fixed. Consequently, similar to the first embodiment, it is possible to further increase the mounting area of the printed wiring board 20A.

The printed wiring board 20A is fixed between the convex portions 32A of the first plate-shaped member 30A and the large diameter portions 83 of the screw members 80. Thus, similar to that in the first embodiment, the printed wiring board 20A is prevented from becoming loose, and the optical device 100A is durable against vibration and impact.

In the optical device 100A, the nut members 90 and the connector pins 23A do not project out from the surface of the second plate-shaped member 50A. Consequently, similar to that in the first embodiment, it is possible to save space when the optical device 100A is fixed to the object to be fixed.

In the optical device 100A, the height from the surface of the printed wiring board 20A (surface facing the second plate-shaped member 50A) to the surface of the second plate-shaped member 50A is determined by the total of the thickness of the second plate-shaped member 50A and the height of the large diameter portion 83 of the screw member 80. Consequently, high dimensional accuracy can be achieved. Hence, similar to that in the first embodiment, when the connector pins 23A are to be connected to the receptacle connector of the object to be fixed, the optical device 100A can prevent or significantly suppress a situation where a gap is formed or an insufficient electrical connection is made.

Third Embodiment

Figure 14:
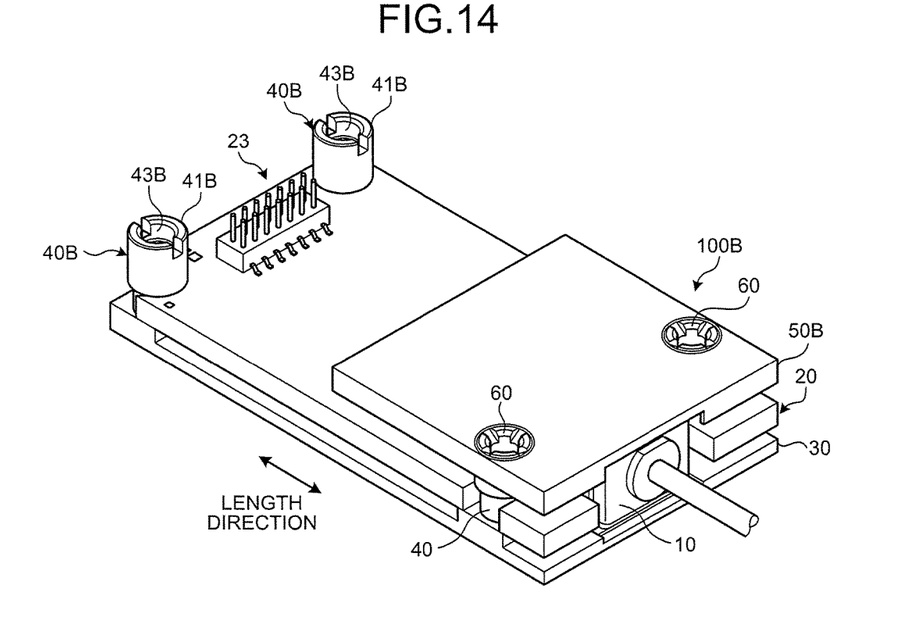
FIG. 14 is a schematic perspective view illustrating a configuration of an optical device according to a third embodiment.

FIG. 14 is a schematic perspective view illustrating a configuration of an optical device according to a third embodiment. In an optical device 100B, the second plate-shaped member 50 is replaced with a second plate-shaped member 50B, two of the four first screw members 40 are replaced with first screw members 40B, and two of the four second screw members 60 are eliminated, from the configuration of the optical device 100 illustrated in FIG. 1.

The second plate-shaped member 50B has a length such that the optical module 10 can be sandwiched between the first plate-shaped member 30 and the second plate-shaped member 50B in the length direction, and for example, has a length about the same as that of the optical module 10. Consequently, the second plate-shaped member 50B does not interfere with the connector pins 23 of the printed wiring board 20, even if a notch portion is not formed. The shape of the first screw member 40B is substantially the same as that of the first screw member 40. A through hole 43B that penetrates through the first screw member 40B from a head portion 41B along the center axis is formed on the first screw member 40B. A screw thread need not be formed on the inner wall of the through hole 43B.

In the optical device 100B, the printed wiring board 20 is fixed to the first plate-shaped member 30, by the two first screw members 40 and the two first screw members 40B. The two first screw members 40 are fixed to the second plate-shaped member 50B by the two second screw members 60. Consequently, the optical module 10 is fixedly retained between the first plate-shaped member 30 and the second plate-shaped member 50B. As a result, similar to the first embodiment, it is possible to further increase the mounting area of the printed wiring board 20. Moreover, similar to the first embodiment, the optical device 100B is durable against vibration and impact, and it is possible to save space when the optical device 100B is fixed to the object to be fixed. Consequently, when the connector pins 23 are to be connected to the receptacle connector of the object to be fixed, it is possible to prevent or significantly suppress a situation where a gap is formed or an insufficient electrical connection is made.

Modification of First Fixing Member and Second Fixing Member

In the above embodiment, each of the first fixing member and the second fixing member is a screw member or a nut member, and the fixing is made by screwing. However, the fixing made by the first fixing member and the second fixing member is not limited to the screwing.

Figure 15:
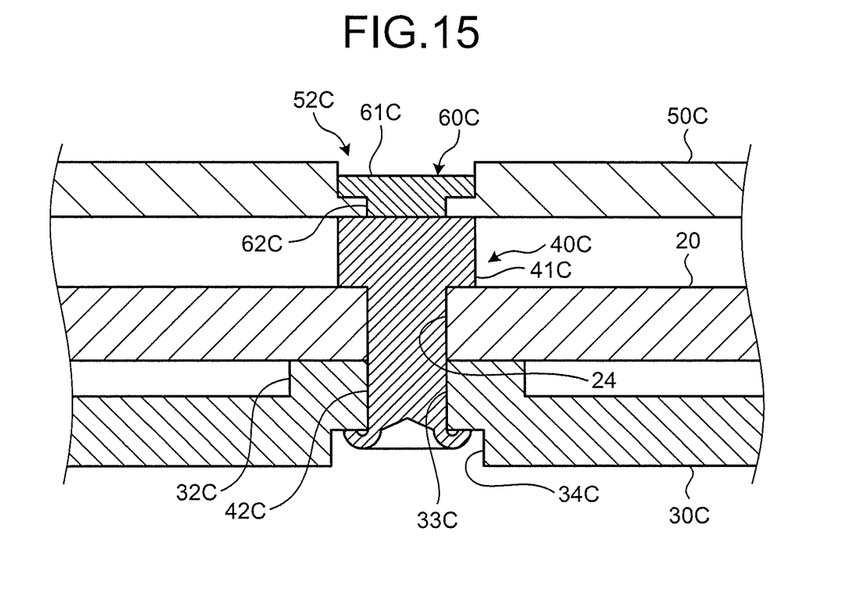
FIG. 15 is a schematic cross-sectional view illustrating a first modification of a first fixing member and a second fixing member.

FIG. 15 is a schematic cross-sectional view illustrating a first modification of the first fixing member and the second fixing member.

A first plate-shaped member 30C includes four convex portions 32C that come into contact with the printed wiring board 20. The convex portions 32C are formed at positions where portions formed with the four openings 24 of the printed wiring board 20 come into contact with the four respective convex portions 32C when the printed wiring board 20 is mounted on the first plate-shaped member 30C. Moreover, a through hole 33C is formed on each of the convex portions 32C. Furthermore, a concave portion 34C is formed at a position facing each of the convex portions 32C.

A first fixing member 40C is a rivet including a head portion 41C that has a substantially cylindrical shape and a body portion 42C that has a substantially cylindrical shape and is one aspect of the fixing portion. When the first fixing member 40C is inserted into each of the openings 24 of the printed wiring board 20 and each of the through holes 33C of the first plate-shaped member 30C, and the tip end of the body portion 42C is caulked, the tip end of the body portion 42C *comes* into contact with the bottom surface of the concave portion 34C. The printed wiring board 20 will be fixed to the first plate-shaped member 30C when the convex portions 32C of the first plate-shaped member 30C and the head portions 41C of the first fixing members 40C come into contact with the printed wiring board 20.

A second plate-shaped member 50C is disposed such that the printed wiring board 20 is interposed between the second plate-shaped member 50 and the first plate-shaped member 30. Four countersunk holes 52C through which second fixing members 60C, which will be described below, are to be inserted, are formed on the second plate-shaped member 50C. The countersunk holes 52C are formed at positions corresponding to four respective first fixing members 40C.

The second fixing member 60C includes a head portion 61C having a substantially cylindrical shape, and a body portion 62C that can be fixed to the head portion 41C of the first fixing member 40C and is one aspect of the fixing portion.

The body portion 62C of the second fixing member 60C is fixed to the head portion 41C of the first fixing member 40C, by inserting the second fixing member 60C to each of the countersunk holes 52C of the second plate-shaped member 50C. The body portion 62C can be fixed to the head portion 41C by applying an adhesive agent, performing press fitting, performing shrinkage fitting, and the like. The first fixing members 40C will be fixed to the second plate-shaped member 50C when the head portions 41C of the first fixing members 40C and the head portions 61C of the second fixing members 60C come into contact with the second plate-shaped member 50C.

Figure 16:
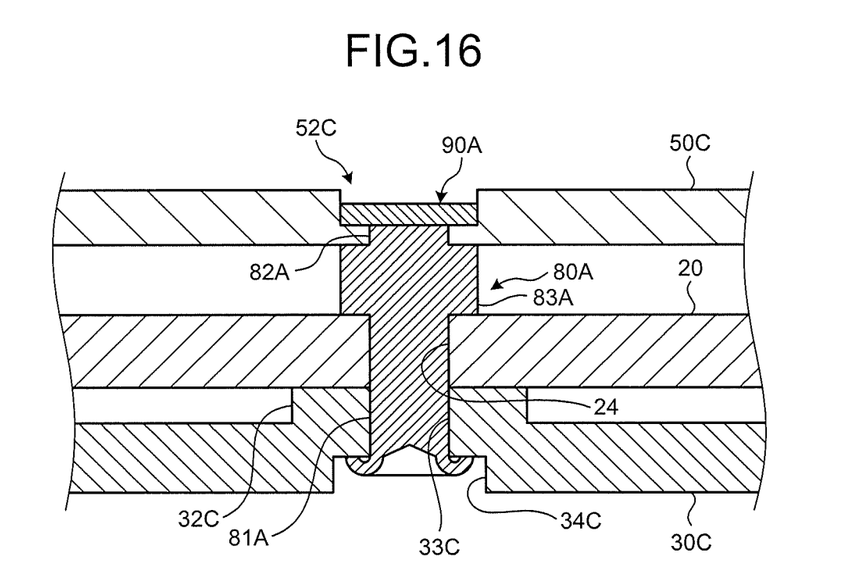
FIG. 16 is a schematic cross-sectional view illustrating a second modification of the first fixing member and the second fixing member.

FIG. 16 is a schematic cross-sectional view illustrating a second modification of the first fixing member and the second fixing member.

A first fixing member 80A includes a first body portion 81A that has a substantially cylindrical shape and is one aspect of the first fixing portion, a second body portion 82A that has a substantially cylindrical shape and is one aspect of the second fixing portion, and a large diameter portion 83A that is placed between the first body portion 81A and the second body portion 82A. When the first body portion 81A of the first fixing member 80A is inserted into each of the openings 24 of the printed wiring board 20 and each of the through holes 33C of the first plate-shaped member 30C, and the tip end of the first body portion 81A is caulked, the tip end of the first body portion 81A comes into contact with the bottom surface of the concave portion 34C. The printed wiring board 20 will be fixed to the first plate-shaped member 30C when the convex portions 32C of the first plate-shaped member 30C and the large diameter portions 83A come into contact with the printed wiring board 20.

A second fixing member 90A is configured so as to be able to fix to the second body portion 82A of the first fixing member 80A.

The second fixing member 90A is fixed to the second body portion 82A, by inserting the second body portion 82A of the first fixing member 80A to each of the countersunk holes 52C of the second plate-shaped member 50C. The second fixing member 90A can be fixed to the second body portion 82A, by applying an adhesive agent, performing press fitting, performing shrinkage fitting, and the like. The first fixing member 80A will be fixed to the second plate-shaped member 50C when the large diameter portions 83A of the first fixing members 80A and the second fixing members 90A come into contact with the second plate-shaped member 50C.

In the above embodiments, the optical module is a wavelength-tunable semiconductor laser module including a wavelength-tunable semiconductor laser device. However, the optical module is not limited to the wavelength-tunable semiconductor laser module. For example, the optical module may be a wavelength-tunable laser besides the semiconductor laser device, a semiconductor laser that is not provided with a wavelength-tunable function, or an optical module that includes the other optical device such as a light receiving device and an optical modulator.

In the above embodiments, the heat sink is interposed between the optical module and the first plate-shaped member and between the optical module and the second plate-shaped member. However, the heat sink may be interposed at least one of between the optical module and the first plate-shaped member and between the optical module and the second plate-shaped member. The first plate-shaped member and the second plate-shaped may have a flat shape without a concave portion. Alternatively, a convex portion may be formed on the first plate-shaped member and the second plate-shaped member instead of the concave portion.

If heat need not be dissipated from at least one of the first plate-shaped member and the second plate-shaped member in the optical module, an elastic member may be interposed at least one of between the optical module and the first plate-shaped member and between the optical module and the second plate-shaped member. For example, the elastic is one of a thin sheet-like member, a relatively thick pad-like member, and something like grease, which are made of rubber, silicon, or resin foam.

If heat is to be dissipated from one of the first plate-shaped member or the second plate-shaped member in the optical module, a heat sink may be interposed between the optical module and the plate-shaped member at the side where heat is to be dissipated, and an elastic member may be interposed between the optical module and the plate-shaped member at the side where heat need not be dissipated.

In the above second embodiment, the opening formed on the printed wiring board is a hole. However, the opening may have a notch-shape similar to that in the first embodiment. In this case, it is preferable to form the opening in a notch-shape so as each of the large diameter portions of the screw member comes into contact with the printed wiring board over one-half of the length of the large diameter portion in the outer circumference direction or more.

With the present disclosure, it is possible to provide the optical device in which the mounting area of the printed wiring board provided with the control circuit is increased.

Although the present disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical device, comprising:
    an optical module provided with an electrical pin;
    a printed wiring board that is connected to the electrical pin of the optical module, on which a control circuit for controlling the optical module is mounted, and on which an opening is formed;
    a first plate-shaped member to which the printed wiring board is fixed;
    a first fixing member that is inserted into the opening of the printed wiring board, and that fixes the printed wiring board with the first plate-shaped member;
    a second plate-shaped member that is disposed such that the printed wiring board is interposed between the second plate-shaped member and the first plate-shaped member; and
    a second fixing member that fixes the first fixing member with the second plate-shaped member such that the optical module is retained between the first plate-shaped member and the second plate-shaped member.

2. The optical device according to claim 1, wherein
    a connector pin is provided on the printed wiring board, and
    each of the second fixing member and the connector pin does not project out from a surface of the second plate-shaped member, the surface being opposite to another surface of the second plate-shaped member, the another surface facing the printed wiring board.

3. The optical device according to claim 1, wherein
    the first fixing member includes a head portion and a fixing portion,
    the printed wiring board is fixed to the first plate-shaped member when the fixing portion of the first fixing member is fixed to the first plate-shaped member, and the first plate-shaped member and the head portion of the first fixing member come into contact with the printed wiring board,
    the second fixing member includes a head portion and a fixing portion, and
    the first fixing member is fixed to the second plate-shaped member when the fixing portion of the second fixing member is fixed to the head portion of the first fixing member, and the head portion of the first fixing member and the head portion of the second fixing member come into contact with the second plate-shaped member.

4. The optical device according to claim 3, wherein the head portion of the first fixing member comes into contact with the printed wiring board along a length which is one-half or more of a length of the head portion in an outer circumference direction of the head portion of the first fixing member.

5. The optical device according to claim 3, wherein the fixing portion is a screw portion formed with a screw, in the first fixing member or the second fixing member.

6. The optical device according to claim 3, wherein, in the first fixing member and the second fixing member, the fixing portion is a screw portion formed with a screw.

7. The optical device according to claim 6, wherein the screw portion of the first fixing member is an external thread and a screw hole is formed in the head portion of the first fixing member, and the screw portion of the second fixing member is an external thread that is to be screwed into the screw hole in the head portion of the first fixing member.

8. The optical device according to claim 1, wherein a through hole is formed in the first fixing member and the second fixing member to penetrate through the first fixing member and the second fixing member along a center axis of the first fixing member and the second fixing member.

9. The optical device according to claim 1, wherein
the first fixing member includes a first fixing portion and a second fixing portion, and fixes the printed wiring board with the first plate-shaped member, when the first fixing portion is inserted into the opening of the printed wiring board, and
the second fixing member fixes the first fixing member with the second plate-shaped member such that the optical module is retained between the first plate-shaped member and the second plate-shaped member when the second fixing member is fixed to the second fixing portion of the first fixing member.

10. The optical device according to claim 9, wherein
the first fixing member includes a large diameter portion placed between the first fixing portion and the second fixing portion,
the printed wiring board is fixed to the first plate-shaped member when the first fixing portion is fixed to the first plate-shaped member, and the first plate-shaped member and the large diameter portion come into contact with the printed wiring board, and
the first fixing member is fixed to the second plate-shaped member when the second fixing member is fixed to the second fixing portion of the first fixing member, and the second fixing member and the large diameter portion come into contact with the second plate-shaped member.

11. The optical device according to claim 10, wherein the large diameter portion of the first fixing member comes into contact with the printed wiring board along a length which is one-half or more of a length of the large diameter portion in an outer circumference direction of the large diameter portion.

12. The optical device according to claim 10, wherein, in the first fixing member, the first fixing portion and the second fixing portion are a screw portion formed with a screw, and the second fixing member is a nut member.

13. The optical device according to claim 9, wherein a through hole is formed in the first fixing member to penetrate through the first fixing member along a center axis of the first fixing member.

14. The optical device according to claim 1, wherein a heat sink is interposed at least one of between the optical module and the first plate-shaped member and between the optical module and the second plate-shaped member.

15. The optical device according to claim 14, wherein the heat sink is a heat dissipation pad, a heat dissipation sheet, or a heat dissipation grease.

16. The optical device according to claim 1, wherein an elastic member is interposed at least one of between the optical module and the first plate-shaped member and between the optical module and the second plate-shaped member.

17. The optical device according to claim 1, wherein the optical module includes a semiconductor laser.

18. The optical device according to claim 1, wherein the optical module includes a wavelength-tunable laser.

\* \* \* \* \*